United States Patent
Grant et al.

(10) Patent No.: US 7,205,216 B2
(45) Date of Patent: Apr. 17, 2007

(54) MODIFICATION OF ELECTRICAL PROPERTIES FOR SEMICONDUCTOR WAFERS

(75) Inventors: Casey J. Grant, Hinesburg, VT (US); Heidi L. Greer, Essex Junction, VT (US); Steven M. Shank, Jericho, VT (US); Michael C. Triplett, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,700

(22) Filed: Jul. 29, 2004

(65) Prior Publication Data

US 2006/0024916 A1  Feb. 2, 2006

(51) Int. Cl.
*H01L 21/20* (2006.01)
*H01L 21/31* (2006.01)

(52) U.S. Cl. ...................... 438/503; 438/777
(58) Field of Classification Search ................ 438/503
See application file for complete search history.

(56) References Cited

U.S. PATENT DOCUMENTS

| | | | | |
|---|---|---|---|---|
| 3,769,104 A * | 10/1973 | Ono et al. ................. 117/106 |
| 4,603,059 A * | 7/1986 | Kiyosumi et al. .......... 438/396 |
| 4,687,682 A * | 8/1987 | Koze ........................ 438/471 |
| 4,925,809 A * | 5/1990 | Yoshiharu et al. .......... 117/106 |
| 5,121,705 A * | 6/1992 | Sugino ...................... 118/719 |
| 5,296,385 A * | 3/1994 | Moslehi et al. ............ 438/514 |
| 5,571,333 A * | 11/1996 | Kanaya ..................... 118/724 |
| 6,448,180 B2 * | 9/2002 | Mani et al. ................ 438/680 |
| 6,454,854 B1 * | 9/2002 | Ose ........................... 117/90 |
| 6,670,283 B2 | 12/2003 | Baker et al. |
| 2003/0096507 A1 | 5/2003 | Baker et al. |
| 2003/0119288 A1 * | 6/2003 | Yamazaki et al. .......... 438/565 |

* cited by examiner

*Primary Examiner*—Lex H. Malsawma
(74) *Attorney, Agent, or Firm*—Schmeiser, Olsen & Watts; William D. Sabo (57) ABSTRACT

A method and structure for fabricating semiconductor wafers. The method comprises providing a plurality of semiconductor wafers. The plurality of semiconductor wafers comprises a first semiconductor wafer and a second semiconductor wafer. The first semiconductor wafer is located adjacent to the second semiconductor wafer. A relationship is provided between a plurality of values for an electrical characteristic and a plurality of materials. A material is chosen from the plurality of materials existing in the relationship. A substructure is formed comprising the material sandwiched between a topside of the first semiconductor wafer and a backside of a portion of the of the second semiconductor wafer. The plurality of semiconductor wafers are placed into a furnace comprising an elevated temperature for processing resulting in a value for the first semiconductor wafer of the electrical characteristic that corresponds to said material in said relationship.

29 Claims, 9 Drawing Sheets

MODIFICATION OF ELECTRICAL PROPERTIES FOR SEMICONDUCTOR WAFERS

BACKGROUND ART

1. Technical Field

The present invention relates to a structure and associated method for manufacturing a plurality of semiconductor wafers.

2. Related Art

The fabrication of microelectronic devices requires multiple processing steps. Some of these steps influence electrical characteristics of these devices. Variability in a process often results in unacceptable variability in the devices. Thus, there exists a need to control or eliminate variability of certain critical processing steps.

SUMMARY OF THE INVENTION

The present invention provides a method of fabricating semiconductor wafers, comprising:

providing a plurality of semiconductor wafers, wherein the plurality of semiconductor wafers comprises a first semiconductor wafer and a second semiconductor wafer, and wherein the first semiconductor wafer is located adjacent to the second semiconductor wafer;

providing a relationship between a plurality of values for an electrical characteristic and a plurality of materials;

choosing a material from the plurality of materials existing in said relationship;

forming a substructure comprising the material sandwiched between a topside of the first semiconductor wafer and a backside of a portion of the of the second semiconductor wafer; and placing the plurality of semiconductor wafers into a furnace for processing, wherein the furnace comprises an elevated temperature resulting in a value for the first semiconductor wafer of the electrical characteristic that corresponds to said material in said relationship.

The present invention provides a method of fabricating semiconductor wafers, comprising:

providing a plurality of semiconductor wafers, wherein the plurality of semiconductor wafers comprises a first semiconductor wafer, a second semiconductor wafer, a third semiconductor wafer, and a forth semiconductor wafer, wherein the first semiconductor wafer is located adjacent to the second semiconductor wafer, and wherein the third semiconductor wafer is located adjacent to the forth semiconductor wafer;

providing a relationship between a plurality of values for an electrical characteristic and a plurality of materials;

choosing a first material from the plurality of materials existing in said relationship; choosing a second material from the plurality of materials existing in said relationship;

forming a first substructure comprising the first material sandwiched between a topside of the first semiconductor wafer and a backside of a portion of the of the second semiconductor wafer;

forming a second substructure comprising the second material sandwiched between a topside of the third semiconductor wafer and a backside of a portion of the of the forth semiconductor wafer;

placing the plurality of semiconductor wafers into a furnace for processing, wherein the furnace comprises an elevated temperature resulting in a first value for the first semiconductor wafer of the electrical characteristic that corresponds to said first material in said relationship and a second value for the third semiconductor wafer of the electrical characteristic that corresponds to said second material in said relationship, and wherein the first value is not a same value as the second value.

The present invention provides an electrical structure, comprising:

a first semiconductor wafer;

a second semiconductor wafer; and a first material, wherein the first material is sandwiched between a topside of the first semiconductor wafer and a backside of the of the second semiconductor wafer, wherein a relationship exists between a plurality of values for an electrical characteristic and a plurality of materials comprising the first material, and wherein the first semiconductor wafer comprises a discrete value from the plurality of values for the electrical characteristic that correlates with the first material in said relationship.

The present invention advantageously provides a method and associated structure to control or eliminate variability of certain critical processing steps during a fabrication of microelectronic devices.

DISCLOSURE OF INVENTION

Figure 1:
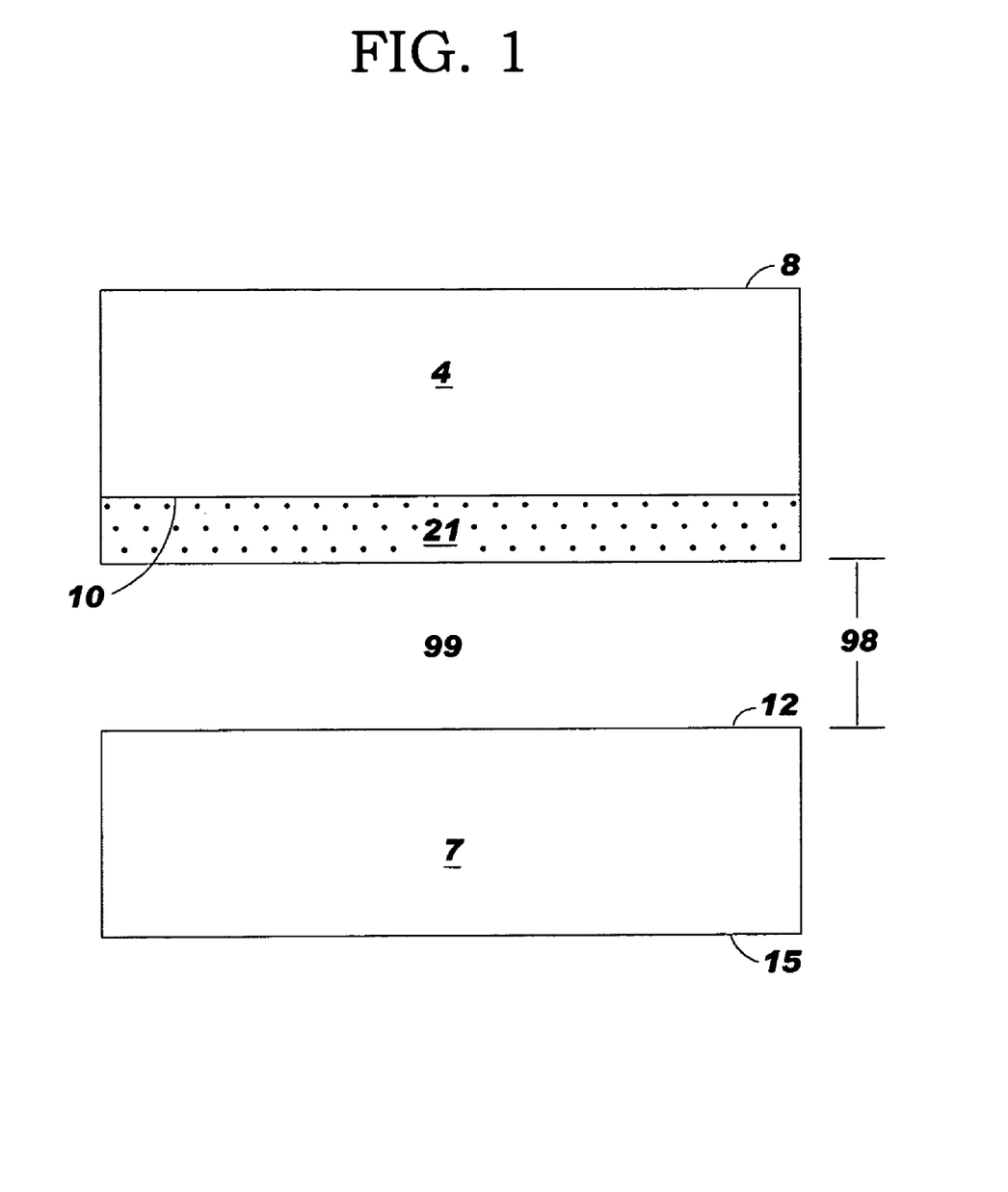
FIG. 1 illustrates a front cross-sectional view of a first semiconductor wafer and a second semiconductor wafer, in accordance with embodiments of the present invention.
Figure 6:
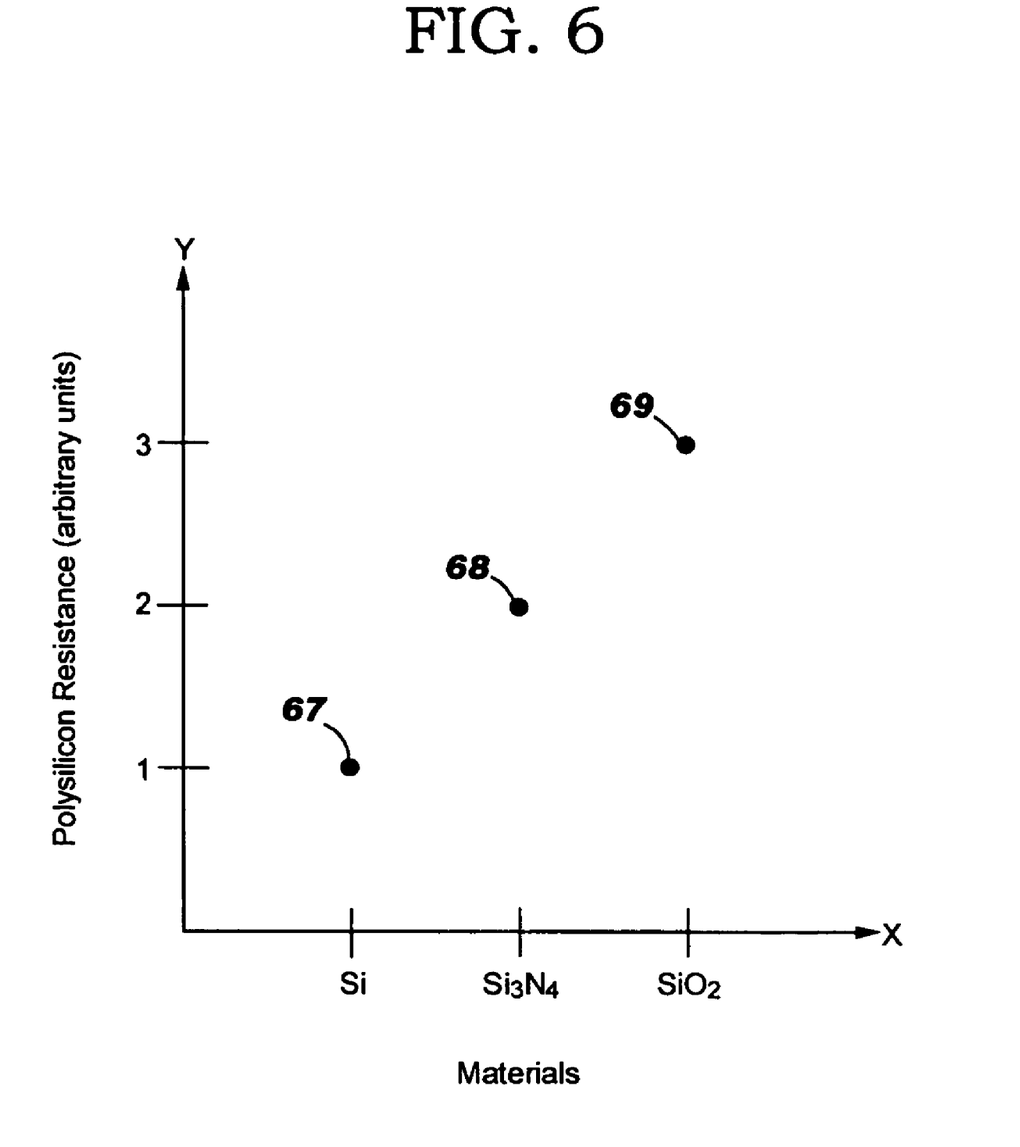
FIG. 6 illustrates a graph for providing a first relationship between a plurality of values for an electrical characteristic, in accordance with embodiments of the present invention.
Figure 7:
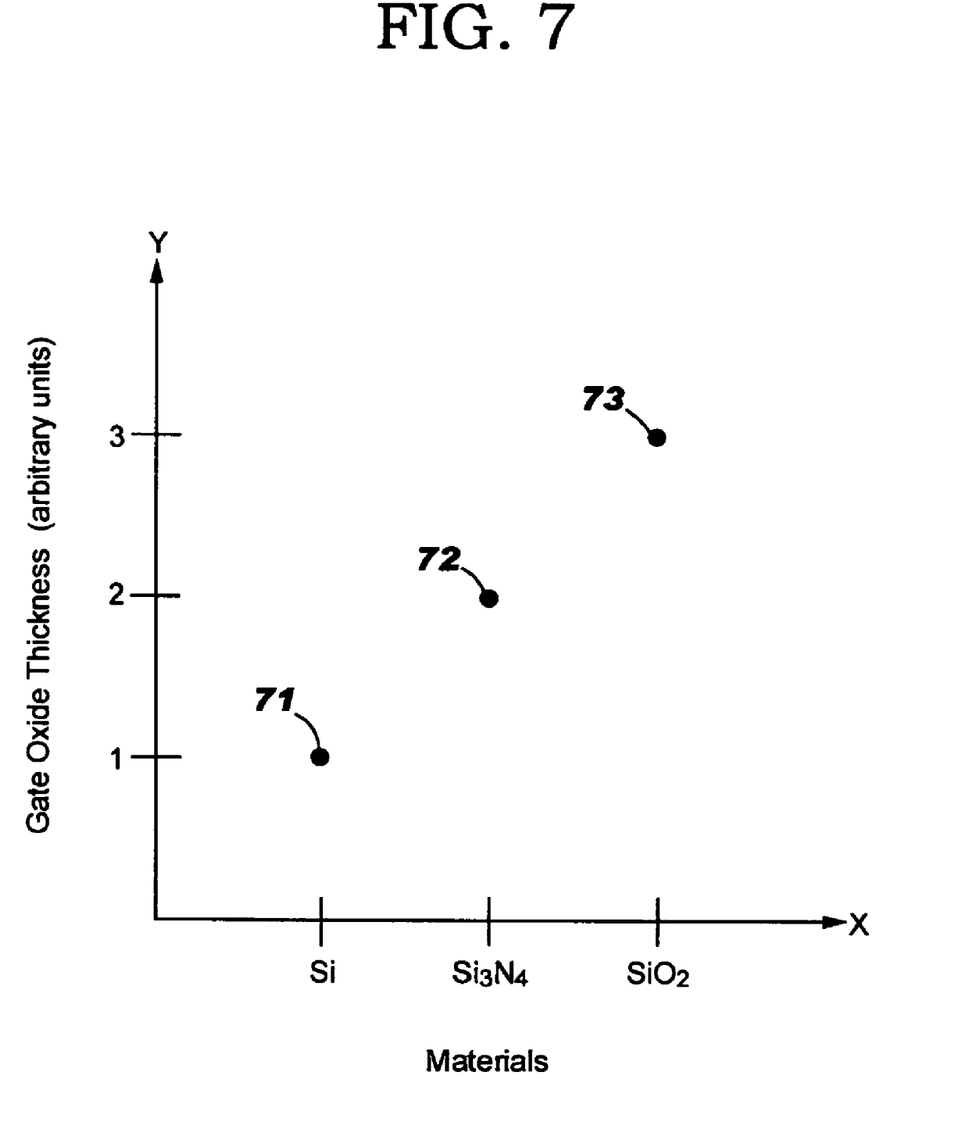
FIG. 7 illustrates a graph for providing a second relationship between a plurality of values for an electrical characteristic, in accordance with embodiments of the present invention.

FIG. 1 illustrates a front cross-sectional view of a first semiconductor wafer 4 and a second semiconductor wafer 7, in accordance with embodiments of the present invention. The first semiconductor wafer 4 comprises a topside 8 and a backside 10. The second semiconductor wafer 7 comprises a topside 12 and a backside 15. The term "topside" of a semiconductor wafer (e.g., topside 8 of the semiconductor wafer 4 and topside 12 of the semiconductor wafer 7) is defined herein including in the claims as a surface of a semiconductor wafer that comprises or will comprise (i.e., through a wafer/semiconductor device manufacturing process) active electrical components (e.g., transistors, resistors, capacitors, etc.) and/or conductive wiring between active electrical components. The term "backside" of a semiconductor wafer (e.g., backside 10 of the semiconductor wafer 4 and backside 15 of the semiconductor wafer 7) is defined herein including in the claims as a surface of a semiconductor wafer that does not comprise active electrical components (e.g., transistors, resistors, capacitors, etc.). The term "wafer/semiconductor device manufacturing process" is defined herein as a process to form a layer(s) of a material (i.e., for producing active electrical components, a mask, a junction (for transistors), an insulating layer, etc.) on a top side of a semiconductor wafer (e.g., topside 8 of the semiconductor wafer 4 and topside 12 of the semiconductor wafer 7). Any wafer/semiconductor device manufacturing process known to a person of ordinary skill in the art may be used for the present invention including, inter alia, diffusion, chemical vapor deposition (CVD) processing, etc. During a CVD process a furnace provides an environment comprising a high temperature (e.g., about 500° C. to about 650° C.) and a controlled gas 99 flow to form the layer(s) of a material. Gases 99 used during a CVD process may include, inter alia, SiH4, nitrogen, etc. During diffusion process a furnace is used to expose the semiconductor wafer to an oxidizing environment at an elevated temperature (e.g., about 600° C. to about 1300° C.) to form the layer(s) of a material. Gases 99 used during a diffusion process may include, inter alia, oxygen, nitrogen, nitrous oxide, hydrogen, etc. During a wafer/semiconductor device manufacturing process, a layer formation (i.e., for producing active electrical components, a mask, a junction (for transistors), an insulating layer, etc.) on a first wafer (e.g., wafer 7) is modulated by a material (e.g., layer 21) that is adjacent to a topside (e.g., topside 12) of the first wafer (e.g., wafer 7) thereby producing values of an electrical characteristic(s) (e.g., resistance such as polysilicon sheet resistance, capacitance, gate oxide thickness, threshhold voltage, standby current, etc) that are dependent upon the material (e.g., layer 21). For example, the semiconductor wafer 4 comprises a film layer 21 of a specified material attached to the backside 10. The film layer 21 comprising the specified material may be selected by providing a relationship between a plurality of values for an electrical characteristic and a plurality of materials (see FIGS. 6–9). The relationship may be, inter alia, graphical (as shown in FIGS. 6 and 7), tabular, etc. The specified material comprised by the film layer 21 may be any material including, inter alia, Si, Si3N4, SiO2, etc. The gas 99 occupies an entire space 98 between film layer 21 and the topside 12 of semiconductor wafer 7. The film layer 21 comprising the specified material is applied to the backside 10 of the semiconductor wafer 4 so that during the wafer/semiconductor device manufacturing process a desired value (i.e., a controlled value) of an electrical characteristic (e.g., resistance such as polysilicon sheet resistance, capacitance, gate oxide thickness, threshold voltage, standby current, etc) for active electrical component(s) (e.g., transistors, resistors, capacitors, etc.) on the topside 12 of the semiconductor wafer 7 may be obtained. Therefore specific discrete values for electrical characteristics of active electrical components (e.g., resistance (e.g., resistance such as polysilicon sheet resistance, capacitance, gate oxide thickness, threshhold voltage, standby current, etc) may be selected based upon specific materials selected (i.e., using the a relationship between a plurality of values for an electrical characteristic and a plurality of materials as shown in FIGS. 6 and 7).

Based on a desired value for electrical characteristics of active electrical components, the film layer 21 (comprising a specific material) may be applied (i.e., coupled) to the backside 10 of the semiconductor wafer 4 prior to the wafer/semiconductor device manufacturing process as shown in FIG. 1. Alternatively a film layer may be removed (in a case where a semiconductor wafer comprises a plurality of film layers) to expose a film layer comprising a specific material as shown in FIGS. 2A and 2B.

Figure 2A:
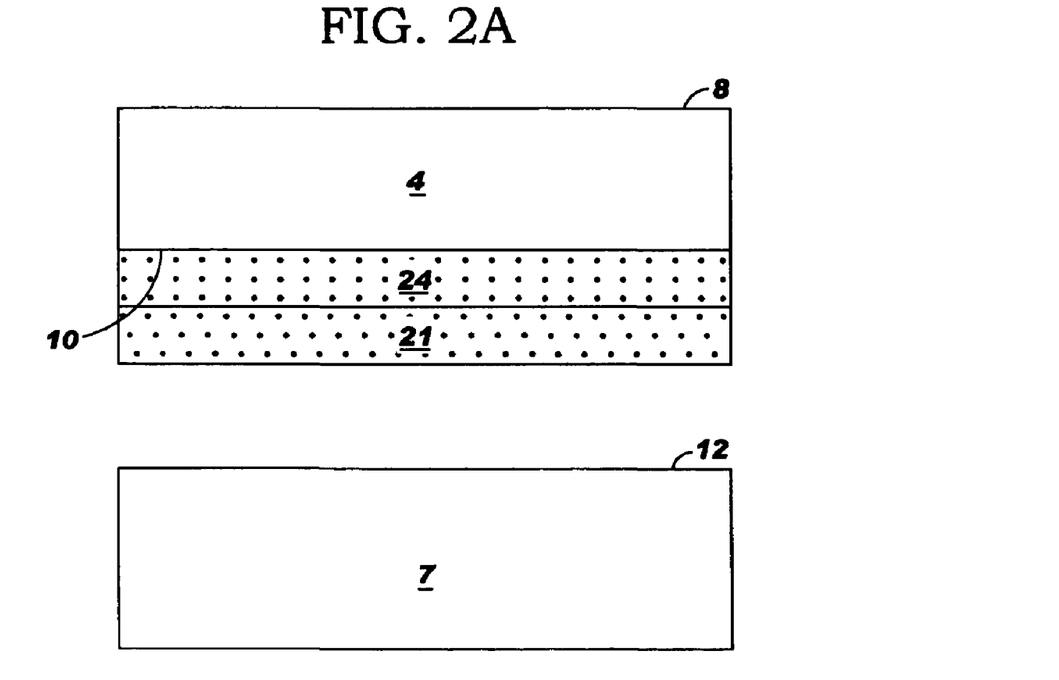
FIGS. 2A and 2B illustrate an alternative to FIG. 1, in accordance with embodiments of the present invention.
Figure 2B:
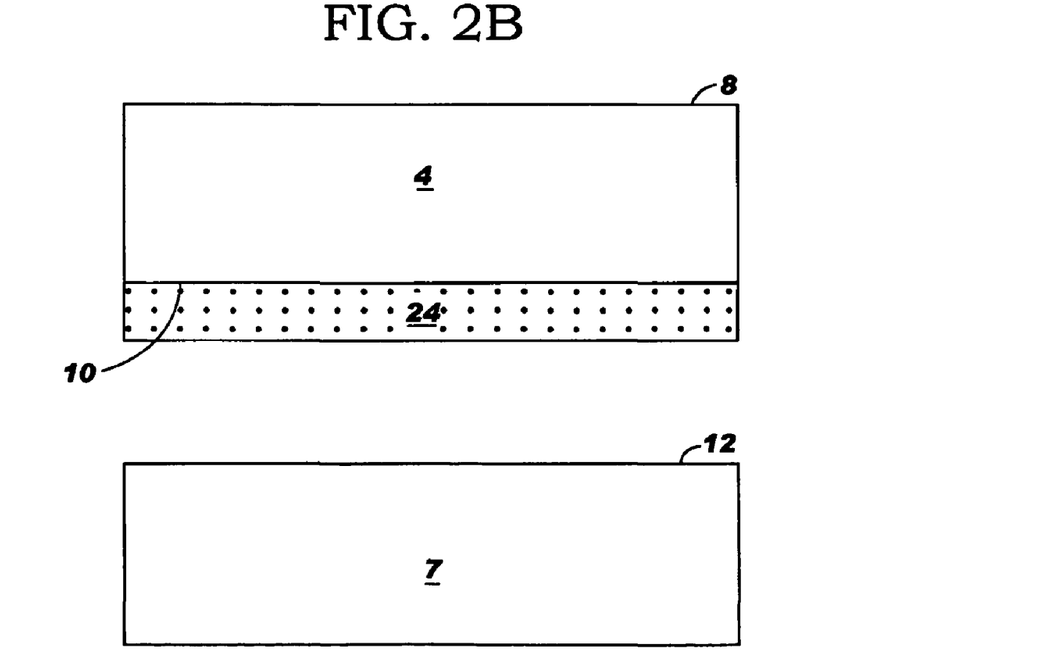

FIGS. 2A and 2B illustrate an alternative to FIG. 1 showing the front cross-sectional view of a first semiconductor wafer 4 and a second semiconductor wafer 7, in accordance with embodiments of the present invention. In contrast to FIG. 1, FIG. 2A comprises a first film layer 24 and a second film layer 21. The first film layer 24 and the second film layer 21 each comprise a different material. The first film layer 24 may comprise any material including, inter alia, Si, Si3N4, SiO2, etc. The second film layer 21 may comprise any material including, inter alia, Si, Si3N4, SiO2, etc. In FIG. 2B the second film layer 21 has been removed so that the first film layer 24 is exposed and adjacent to the topside 12 of the semiconductor wafer 7. A material comprised by the first film layer 24 will produce a desired value (i.e., a controlled value) of an electrical characteristic (e.g., resistance such as polysilicon sheet resistance, capacitance, oxide thickness, threshhold voltage, standby current, etc) for active electrical component(s) (e.g., transistors, resistors, capacitors, etc.) on the topside 12 of the semiconductor wafer 7 during the wafer/semiconductor device manufacturing process. The material used to produce the desired value is selected using the a relationship between a plurality of values for an electrical characteristic and a plurality of materials as shown in FIGS. 6 and 7.

Figure 3:
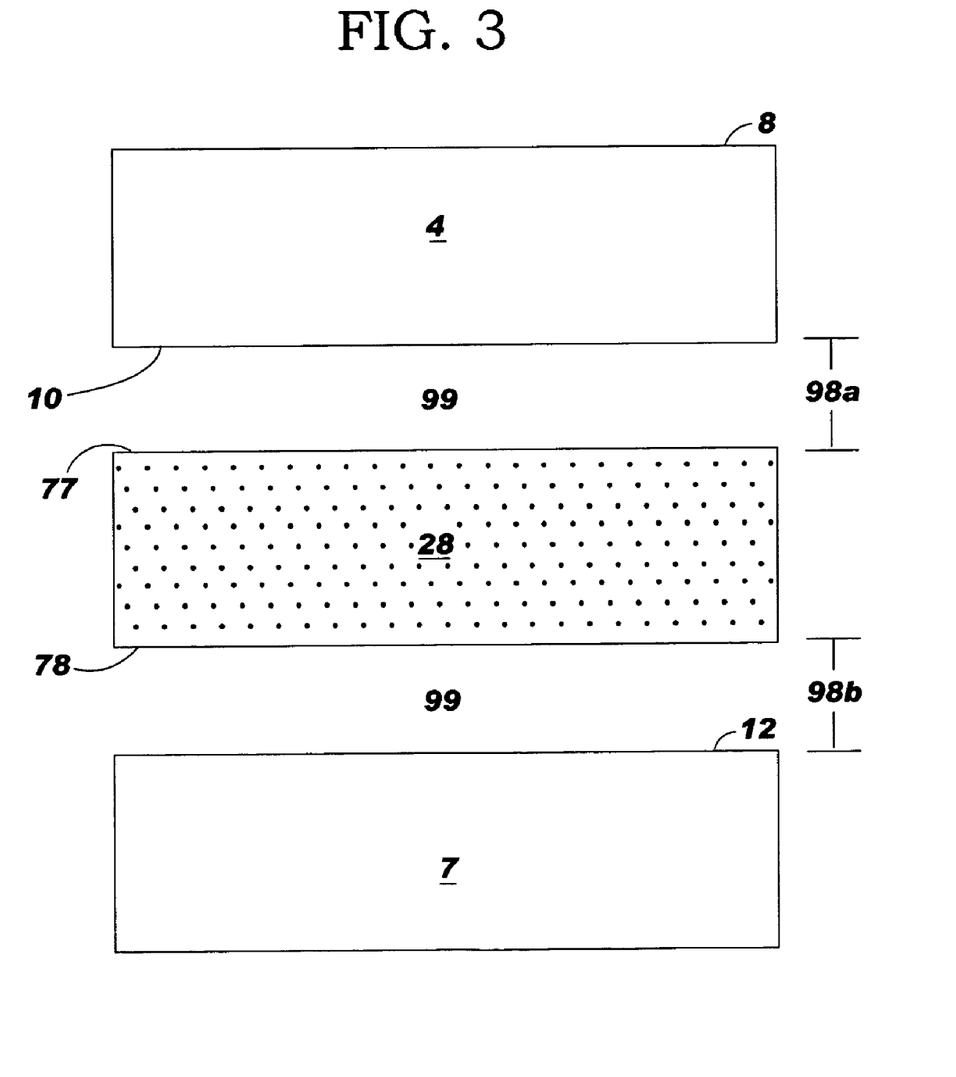
FIG. 3 illustrates an alternative to FIGS. 1, 2A, and 2B, in accordance with embodiments of the present invention.

FIG. 3 illustrates an alternative to FIGS. 1, 2A, and 2B showing a front cross-sectional view of a first semiconductor wafer 4, a second semiconductor wafer 7, and a filler wafer 28, in accordance with embodiments of the present invention. In contrast to FIGS. 1, 2A, and 2B, FIG. 3 comprises a filler wafer 28 (instead of a film layer (e.g., film layer 21 in FIG. 1 or film layer 24 in FIG. 2B) for producing the desired value (i.e., a controlled value) of an electrical characteristic (e.g., resistance such as polysilicon sheet resistance, capacitance, oxide thickness, threshhold voltage, standby current, etc) for active electrical component(s) (e.g., transistors, resistors, capacitors, etc.) on the topside 12 of the semiconductor wafer 7 during the wafer/semiconductor device manufacturing process. The filler wafer is placed between a backside 10 of the semiconductor wafer 4 and a topside 12 of the semiconductor wafer 7. The filler wafer 28 any material including, inter alia, Si, Si3N4, SiO2, etc. The material used to produce the desired value is selected using the a relationship between a plurality of values for an electrical characteristic and a plurality of materials as shown in FIGS. 6 and 7. In FIG. 3, the gas 99 (i.e., as described with reference to FIG. 1) occupies an entire space 98a between a first surface 77 of filler wafer 28 and the back side 10 of semiconductor wafer 7. Additionally, the gas 99 (i.e., as described with reference to FIG. 1) occupies an entire space 98b between a second surface 78 of filler wafer 28 and the topside 10 of semiconductor wafer 7.

Figure 4:
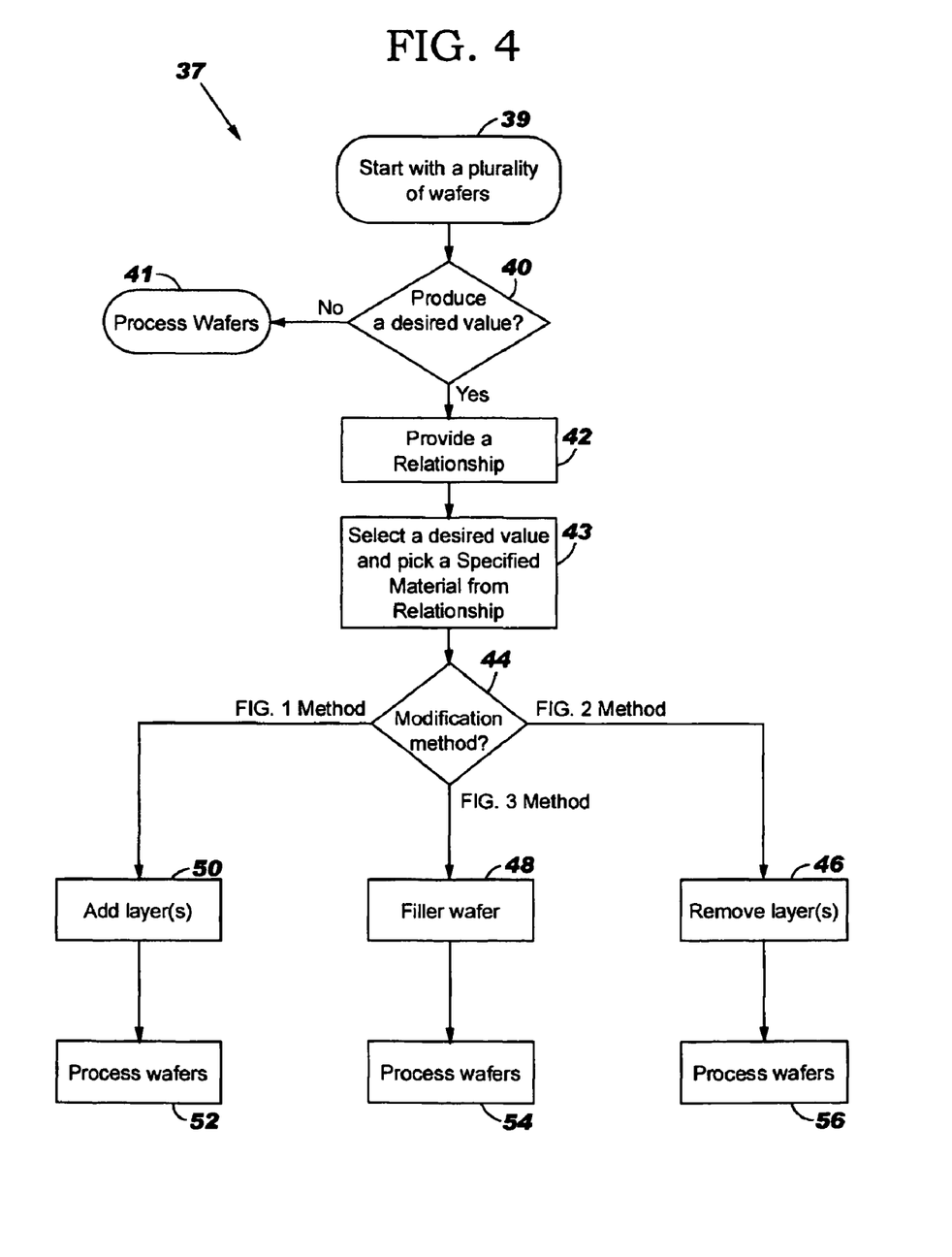
FIG. 4 is a flowchart depicting an algorithm for the wafer/semiconductor device manufacturing process of FIGS. 1–3, in accordance with embodiments of the present invention.

FIG. 4 is a flowchart depicting an algorithm 37 for the wafer/semiconductor device manufacturing process of FIGS. 1–3, in accordance with embodiments of the present invention. In step 39 a plurality of wafers are provided. In step 40 a decision is made as to whether or not a desired (specific) value for an electrical characteristic (s) (e.g., resistance such as polysilicon sheet resistance, capacitance, gate oxide thickness, threshhold voltage, standby current, etc) is required. If a desired value is not required in step 40 then the wafers are subjected to a wafer/semiconductor device manufacturing process. If a desired value is required in step 40 then a relationship between a plurality of values for an electrical characteristic and a plurality of materials must be developed (as shown in FIGS. 6 and 7) in step 42. The relationship may be, inter alia, graphical (as shown in FIGS. 6 and 7), tabular, etc. In step 43 the desired value and associated material to produce the desired value during a wafer/semiconductor device manufacturing process is selected using the relationship developed in step 42. In step 44 a method of adding the associated material to produce the desired value of an electrical characteristic(s) (e.g., resistance such as polysilicon sheet resistance, capacitance, gate oxide thickness, threshhold voltage, standby current, etc) will be determined.

If the method of FIG. 1 is selected in step 44 then step 50 is executed such that the film layer 21 (see FIG. 1) is applied (i.e., coupled) to the wafer 4 (such that the film layer 21 is located between the topside 12 of the semiconductor wafer 7 and a backside 10 the semiconductor wafer 4). In step 52, the wafers 4 and 7 are placed in a furnace for a wafer/semiconductor device manufacturing process thereby producing a desired value (i.e., a controlled value) of an electrical characteristic (e.g., resistance such as polysilicon sheet resistance, capacitance, gate oxide thickness, threshhold voltage, standby current, etc) for active electrical component(s) (e.g., transistors, resistors, capacitors, etc.) on the topside 12 of the semiconductor wafer 7.

If the method of FIG. 2 is selected in step 44 then step 46 is executed such that the film layer 21 (see FIG. 2) is removed front the wafer 4 thereby exposing the film layer 24 (coupled to the semiconductor wafer 4) to the topside 12 of the semiconductor wafer 7. In step 56 the wafers 4 and 7 are placed in a Furnace for wafer/semiconductor device manufacturing process thereby producing a desired value (i.e., a controlled value) of an electrical characteristic (e.g., resistance such as polysilicon sheet resistance, capacitance, gate oxide thickness, threshhold voltage, standby current, etc) for active electrical component(s) (e.g., transistors, resistors, capacitors, etc.) on the topside 12 of the semiconductor wafer 7.

If the method of FIG. 3 is selected in step 44 then step 48 is executed such that the filler wafer 28 (see FIG. 3) is placed (i.e., without attaching to wafer 4 or 7) between the backside 10 of the wafer 4 and the topside 12 of the wafer 7. In step 54, the wafers 4 and 7 and the filler wafer 28 are placed in a furnace for wafer/semiconductor device manufacturing process in step 54 thereby producing a desired value (i.e., a controlled value) of an electrical characteristic (e.g., resistance such as polysilicon sheet resistance, capacitance, gate oxide thickness, threshhold voltage, standby current, etc) for active electrical component(s) (e.g., transistors, resistors, capacitors, etc.) on the topside 12 of the semiconductor wafer 7.

Figure 5:
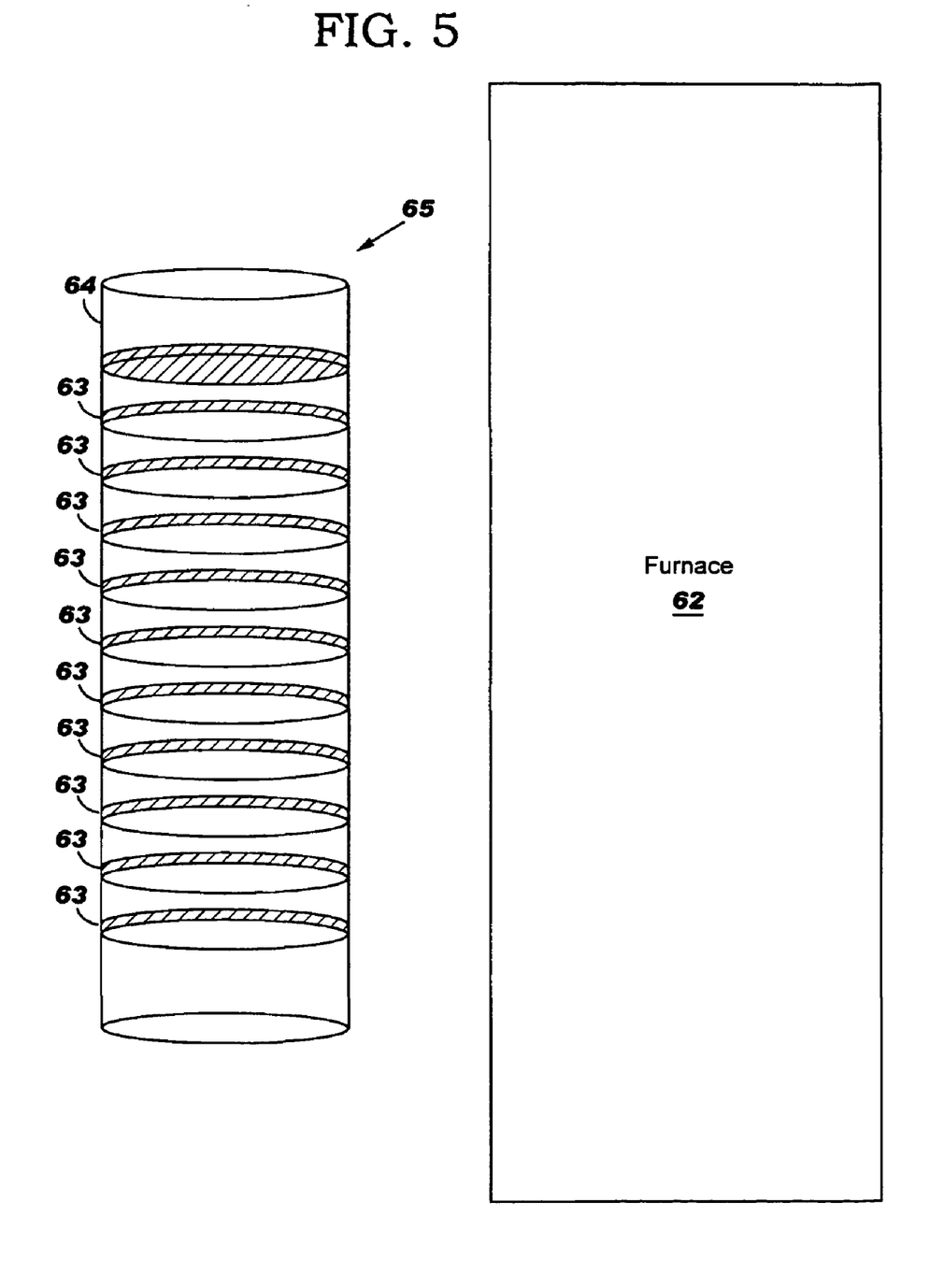
FIG. 5 illustrates a perspective view of a plurality of wafers in a wafer holder for placement in a furnace for a wafer/semiconductor device manufacturing process, in accordance with embodiments of the present invention.

FIG. 5 illustrates a perspective view of a plurality of wafers 63 in a wafer holder 64 for placement in a furnace 62 for wafer/semiconductor device manufacturing process, in accordance with embodiments of the present invention. The plurality of wafers 63 may include a film layer 65 similar to the film layer 21 applied to the wafer 4 and the wafer 7 of FIG. 1. Alternatively, the film layer 65 could be replaced by a film layer analogous to the film layer 24 exposed to the wafer 7 of FIG. 2, the filler wafer 28 between the wafer 4 and the wafer 7 of FIG. 3, or any combination thereof. The wafer holder 64 may comprise any wafer holder material known to a person of ordinary skill in the art including, inter alia, quartz, silicon carbide, etc. The furnace 62 may be any wafer processing furnace known to a person of ordinary skill in the art including, inter alia, PolysiliconLPCVD furnace, a gate oxidation furnace, etc.

FIG. 6 illustrates a graph for providing a first relationship (graphical) between a plurality of values for an electrical characteristic (i.e., polysilicon resistance) and a plurality of materials so that a specific value for an electrical characteristic may selected based on a material selected, in accordance with embodiments of the present invention. The Y-axis represents values for polysilicon resistance in arbitrary units. The X-axis represents the plurality of materials (i.e., Si, Si3N4, and SiO2). The values for polysilicon resistance with respect to a material (i.e., Si, Si3N4, and SiO2) are represented by data points 67, 68, and 69. As illustrated by the data points 67, 68, and 69, it may be determined that the polysilicon resistance values increase as the materials change from Si to Si3N4 to SiO2. Additionally, any combination of materials (i.e., Si, Si3N4, and SiO2) may be used to provide values for polysilicon resistance that fall between the data points 67, 68, and 69.

FIG. 7 illustrates a graph for providing a second relationship (graphical) between a plurality of values for an electrical characteristic (i.e., gate oxide thickness) and a plurality of materials so that specific value for an electrical characteristic may selected based on a material selected, in accordance with embodiments of the present invention. The Y-axis represents values for gate oxide thickness in arbitrary units. The X-axis represents the plurality of materials (i.e., Si, Si3N4, and SiO2). The values for gate oxide thickness with respect to a material (i.e., Si, Si3N4, and SiO2) are represented by data points 71, 72, and 73. As illustrated by the data points 71, 72, and 73, it may be determined that the gate oxide thickness increases as the materials change from Si to Si3N4 to SiO2. Additionally, any combination of materials (i.e., Si, Si3N4, and SiO2) may be used to provide values for gate oxide thickness that fall between the data points 71, 72, and 73.

Figure 8:
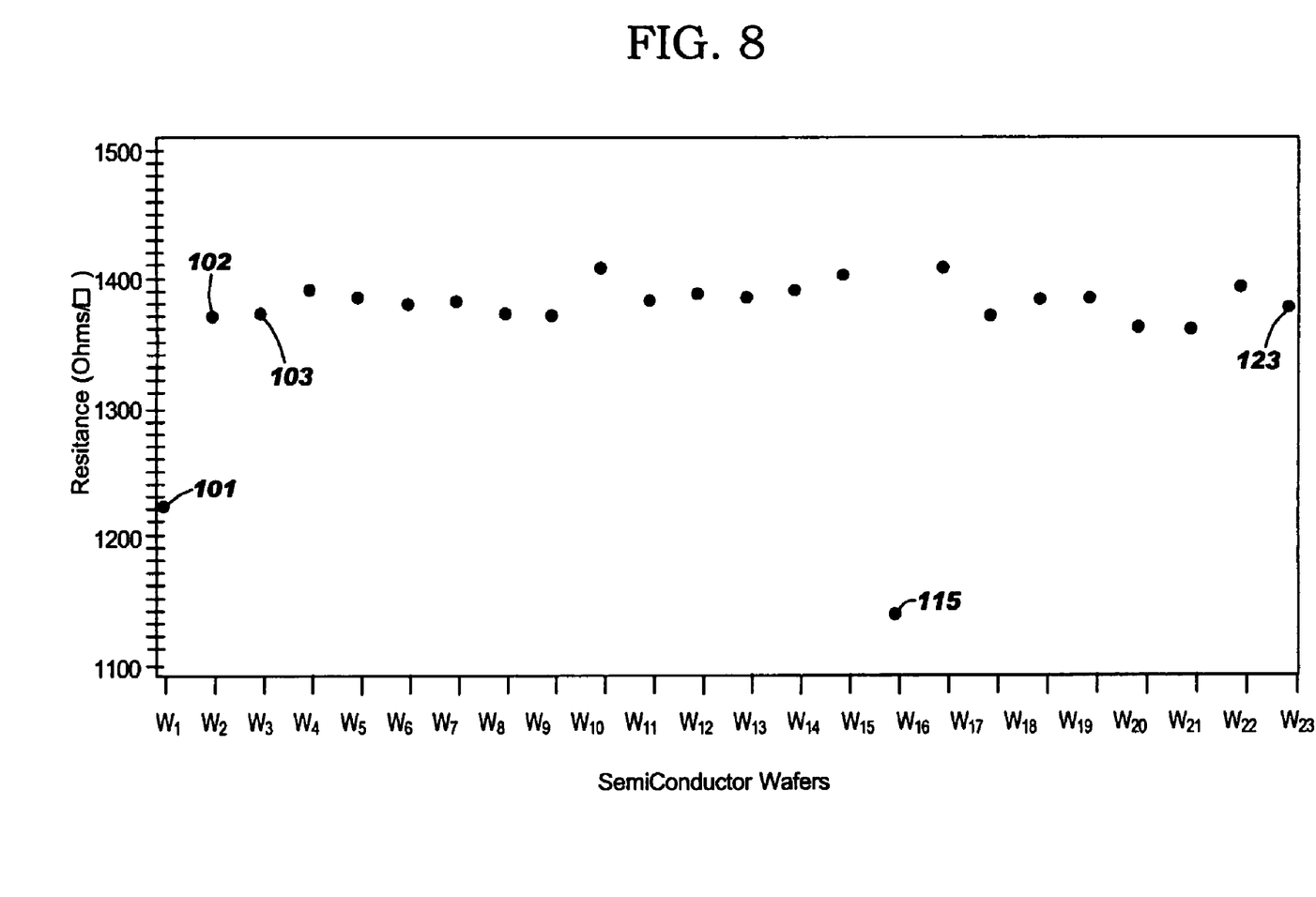
FIG. 8 illustrates a graph of laboratory test data showing polysilicon sheet resistance verses various semiconductor wafers, in accordance with embodiments of the present invention.

FIG. 8 illustrates a graph of laboratory test data showing polysilicon sheet resistance verses various semiconductor wafers W1–W23 with various materials placed above the semiconductor wafers W1–W23 during a wafer/semiconductor device manufacturing process, in accordance with embodiments of the present invention. The semiconductor wafers W1–W23 were placed in a polysilicon LPCVD furnace for 20 minutes at a temperature of 620° C. and a pressure of 150 milliTorr. The semiconductor wafers W1–W23 each comprise a same material (e.g., polysilicon, etc). The X-axis represents the semiconductor wafers W1–W23. The Y-axis represents resistance in ohms. The values for resistance for semiconductor wafers W1–W23 with various materials placed above the semiconductor wafers W1–W23 are represented by the data points 101, 102, . . . , 115 . . . , 123. Data points 102, 103, . . . 114, 116 . . . 123 represent values of resistance (about 1380 ohms+30) for semiconductor wafers comprising a layer of SiO2 above them. Data point 101 represents a value of resistance (about 1225 ohms/ڧ) for a semiconductor wafer comprising a layer of Si3N4 above. Data point 115 represents a value of resistance (about 1135 ohms/ڧ) for a semiconductor wafer comprising a layer of Si above. As illustrated by the data points 101, 102, . . . , 115 . . . , 123 it may be determined that the polysilicon sheet resistance values increase as the materials change from Si to Si3N4 to SiO2 and that based on a material placed above a semiconductor wafer during a wafer/semiconductor device manufacturing process a value of an electrical characteristic (e.g., polysilicon sheet resistance) may be changed.

Figure 9:
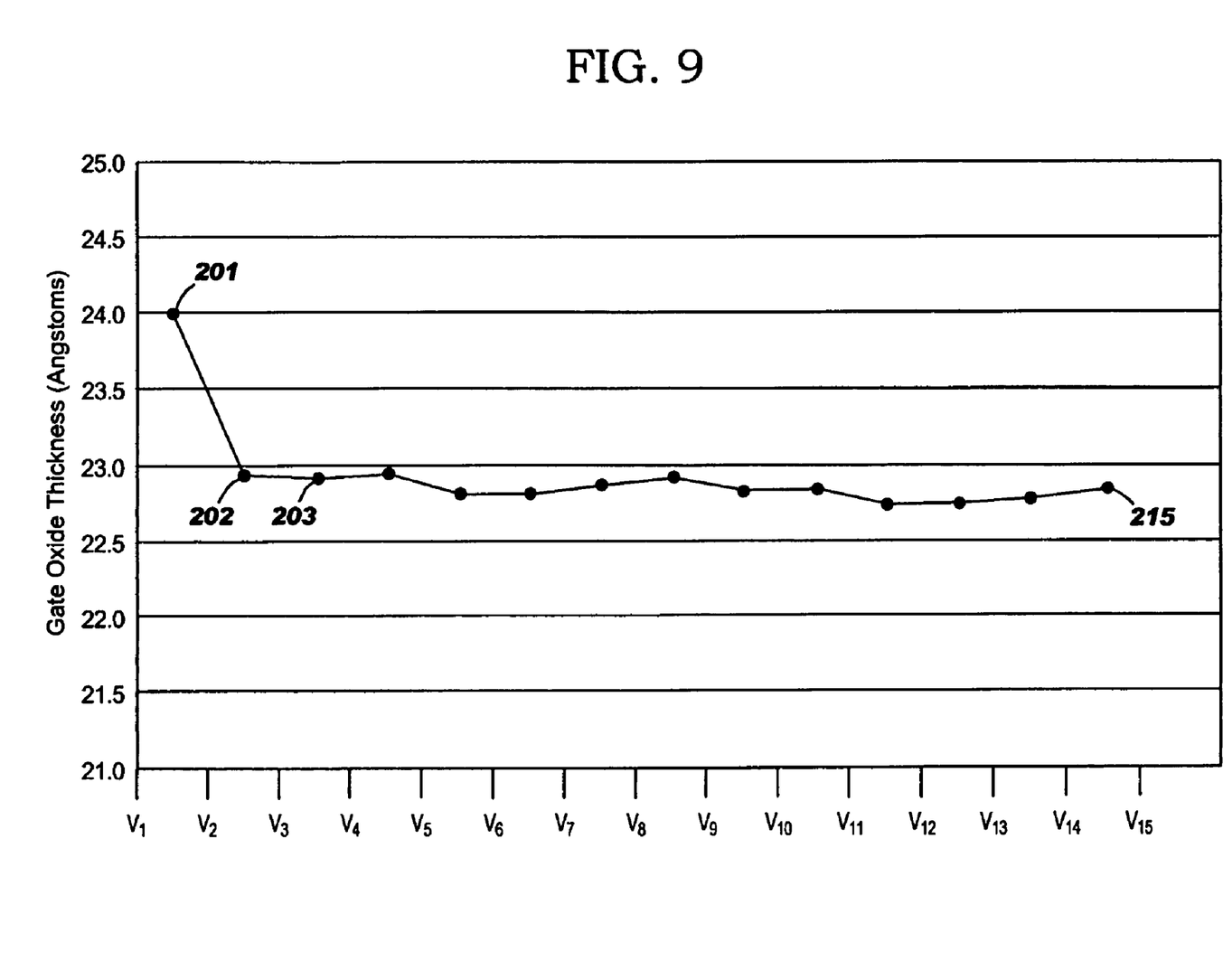
FIG. 9 illustrates a graph of laboratory test data showing Gate oxide thickness verses various semiconductor wafers, in accordance with embodiments of the present invention.

FIG. 9 illustrates a graph of laboratory test data showing Gate oxide thickness verses various semiconductor wafers V1–V15 with various materials placed above the semiconductor wafers V1–V15 during a wafer/semiconductor device manufacturing process, in accordance with embodiments of the present invention. The semiconductor wafers V1–V15 were placed in a gate oxidation furnace for 60 minutes at a temperature of 800° C. degrees and a pressure of 760 Torr. The semiconductor wafers V1–V15 each comprise a same material (e.g., silicon oxynitride). The X-axis represents the semiconductor wafers V1–V15. The Y-axis represents gate oxide thickness in angstroms. The values for gate oxide thickness for semiconductor wafers V1–V15 with various materials placed above the semiconductor wafers V1–V15 are represented by the data points 201, 202, . . . 215. Data points 202 . . . 215 represent values of gate oxide thickness (about 22.8 angstroms+0.3) for semiconductor wafers comprising a layer of Si above them. Data point 201 represents a value of gate oxide thickness (about 24 angstroms) for a semiconductor wafer comprising a layer of SiO2 above. As illustrated by the data points 201, 202, . . . 215, it may be determined that gate oxide thickness increases as the materials change from Si to SiO2 and that based on a material placed above a semiconductor wafer during a wafer/semiconductor device manufacturing process a value of an electrical characteristic (e.g., gate oxide thickness) may be changed.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method of fabricating semiconductor wafers, comprising:
providing a plurality of semiconductor wafers, wherein the plurality of semiconductor wafers comprises a first semiconductor wafer and a second semiconductor wafer, and wherein the first semiconductor wafer is located directly adjacent to the second semiconductor wafer such that no additional semiconductor wafers of said plurality of semiconductor wafers are located between a topside of the first semiconductor wafer and a backside of a portion of the second semiconductor wafer;
providing a relationship between a plurality of values for an electrical characteristic and a plurality of materials;
choosing a material from the plurality of materials existing in said relationship;
forming a substructure comprising the material placed directly between said topside of the first semiconductor wafer and said backside of a portion of the second semiconductor wafer, wherein a gas occupies an entire space between said topside of said first semiconductor wafer and a first side of said material; and
placing the plurality of semiconductor wafers into a furnace for processing, wherein the furnace comprises an elevated temperature that in combination with said material results in a value for the first semiconductor wafer of the electrical characteristic that corresponds to said material in said relationship.

2. The method of claim 1, wherein said forming the substructure comprises applying at least one layer of the material to the backside of the second semiconductor wafer.

3. The method of claim 1, wherein said forming the substructure comprises removing at least one layer of a first material from the backside of the second semiconductor wafer to expose the material.

4. The method of claim 1, wherein said forming the substructure comprises placing a monitor wafer comprising the material between the backside of the second semiconductor wafer and the topside of the first semiconductor wafer.

5. The method of claim 1, wherein the material is selected from the group consisting of Si, Si3N4, and SiO2.

6. The method of claim 5, wherein the furnace is a polysilicon LPCVD furnace.

7. The method of claim 6, wherein the electrical characteristic is polysilicon sheet resistance.

8. The method of claim 5, wherein the furnace is a gate oxidation furnace.

9. The method of claim 8, wherein the electrical characteristic is a gate oxide thickness.

10. The method of claim 1, wherein said relationship is a graphical relationship.

11. The method of claim 1, wherein said relationship is a tabular relationship.

12. The method of claim 1, wherein said value for said first semiconductor wafer is for said topside of said first semiconductor wafer.

13. The method of claim 12, wherein said value for said first semiconductor wafer is for active components on said topside of said first semiconductor wafer.

14. The method of claim 1, wherein said electrical characteristic is selected from the group consisting of polysilicon sheet resistance, capacitance, gate oxide thickness, threshold voltage and standby current.

15. The method of claim 1, wherein said gas occupies an entire space between said backside of said portion of the second semiconductor wafer and a second side of said material.

16. A method of fabricating semiconductor wafers, comprising:
providing a plurality of semiconductor wafers, wherein the plurality of semiconductor wafers comprises a first semiconductor wafer, a second semiconductor wafer, a third semiconductor wafer, and a fourth semiconductor wafer, wherein the first semiconductor wafer is located directly adjacent to the second semiconductor wafer such that no additional semiconductor wafers of said plurality of semiconductor wafers is located between a topside of the first semiconductor wafer and a backside of a portion of the second semiconductor wafer, and wherein the third semiconductor wafer is located directly adjacent to the fourth semiconductor wafer such that no additional semiconductor wafers of said plurality of semiconductor wafers is located between a topside of the third semiconductor wafer and a backside of a portion of the fourth semiconductor wafer;
providing a relationship between a plurality of values for an electrical characteristic and a plurality of materials;
choosing a first material from the plurality of materials existing in said relationship;
choosing a second material from the plurality of materials existing in said relationship;
forming a first substructure comprising the first material placed between said topside of the first semiconductor wafer and said backside of a portion of the of the second semiconductor wafer, wherein a gas occupies an entire space between said topside of said first semiconductor wafer and said first material;

forming a second substructure comprising the second material placed between said topside of the third semiconductor wafer and said backside of a portion of the of the fourth semiconductor wafer, wherein said gas occupies an entire space between said topside of said second semiconductor wafer and said second material;

placing the plurality of semiconductor wafers into a furnace for processing, wherein the furnace comprises an elevated temperature that in combination with said material results in a first value for the first semiconductor wafer of the electrical characteristic that corresponds to said first material in said relationship and a second value for the third semiconductor wafer of the electrical characteristic that corresponds to said second material in said relationship, and wherein the first value is not a same value as the second value.

17. The method of claim 16, wherein said forming the first substructure comprises applying at least one layer of the first material to the backside of the second semiconductor wafer, and wherein said forming the second substructure comprises applying at least one layer of the second material to the backside of the fourth semiconductor wafer.

18. The method of claim 16, wherein said forming the first substructure comprises removing at least one layer of a third material from the backside of the second semiconductor wafer to expose the first material, and wherein said forming the second substructure comprises removing at least one layer of a fourth material from the backside of the fourth semiconductor wafer to expose the second material.

19. The method of claim 16, wherein said forming the first substructure comprises placing a first monitor wafer comprising the first material between the backside of the second wafer and the topside of the first semiconductor wafer, and wherein said forming the second substructure comprises placing a second monitor wafer comprising the second material between the backside of the fourth semiconductor wafer and the topside of the third semiconductor wafer.

20. The method of claim 16, wherein the first material and the second material are each selected from the group consisting of Si, Si3N4, and SiO2.

21. The method of claim 20, wherein the furnace is a polysilicon LPCVD furnace.

22. The method of claim 21, wherein the electrical characteristic is polysilicon sheet resistance.

23. The method of claim 20, wherein the furnace is a gate oxidation furnace.

24. The method of claim 23, wherein the electrical characteristic is a gate oxide thickness.

25. The method of claim 16, wherein said relationship is a graphical relationship.

26. The method of claim 16, wherein said relationship is a tabular relationship.

27. The method of claim 16, wherein said value for said first semiconductor wafer is for said topside of said first semiconductor wafer.

28. The method of claim 27, wherein said value for said first semiconductor wafer is for active components on said said topside of said first semiconductor wafer.

29. The method of claim 16, wherein said electrical characteristic is selected from the group consisting of polysilicon sheet resistance, capacitance, gate oxide thickness, threshold voltage and standby current.

* * * * *